US012411418B2

(12) United States Patent
Small (10) Patent No.: US 12,411,418 B2
(45) Date of Patent: Sep. 9, 2025

(54) FREEFORM METROLOGY INFORMATION ACQUISITION SYSTEM

(71) Applicant: Ruckus Space, LLC, Portland, OR (US)

(72) Inventor: Shawn Small, Portland, OR (US)

(73) Assignee: RUCKUS SPACE, LLC, Portland, OR (US)

(*) Notice: Subject to any disclaimer, the term of this patent is extended or adjusted under 35 U.S.C. 154(b) by 289 days.

(21) Appl. No.: 18/121,991

(22) Filed: Mar. 15, 2023

(65) Prior Publication Data

US 2023/0305406 A1 Sep. 28, 2023

Related U.S. Application Data

(60) Provisional application No. 63/324,535, filed on Mar. 28, 2022.

(51) Int. Cl.
*G03F 7/20* (2006.01)
*G03F 7/00* (2006.01)

(52) U.S. Cl.
CPC .............. *G03F 7/704* (2013.01); *G03F 7/705* (2013.01)

(58) Field of Classification Search
CPC ................................ G03F 7/704; G03F 7/705
See application file for complete search history.

(56) References Cited

FOREIGN PATENT DOCUMENTS

WO    WO-2016202852 A1 * 12/2016 ........... G01B 11/002

* cited by examiner

*Primary Examiner* — Jamil Ahmed
(74) *Attorney, Agent, or Firm* — Alleman Hall & Tuttle LLP (57) ABSTRACT

A freeform metrology information acquisition system is disclosed. The system includes a measurement probe, one or more cameras, and a computing device. The measurement probe is configured to obtain metrology information for an object under inspection. The camera(s) are configured to image a scene including the measurement probe and the object under inspection. The computing device is configured to receive the metrology information from the measurement probe, receive one or more images from the one or more cameras, determine a position of the measurement probe in the scene based at least on the one or more images, spatially registering the metrology information acquired by the measurement probe to one or more determined positions of the measurement probe in the scene, and visually present, via a display, a visual representation of the metrology information spatially registered to the one or more determined positions of the measurement probe in the scene.

20 Claims, 8 Drawing Sheets

FREEFORM METROLOGY INFORMATION ACQUISITION SYSTEM

CROSS REFERENCE TO RELATED APPLICATIONS

This application claims priority to U.S. Patent Application Ser. No. 63/324,535, filed Mar. 28, 2022, the entirety of which is hereby incorporated herein by reference for all purposes.

BACKGROUND

Metrology information provides standard units of measurement that are used to describe physical characteristics of an object. For example, metrology information for an object under inspection can be acquired to assess a state or quality of the object. In particular, the metrology information for the object can be compared to specified thresholds or requirements to determine whether conformity is achieved for different physical characteristics of the object under inspection. Traditional methods of metrology information acquisition rely on devices that have complex assemblies that are configured to acquire metrology information for specific objects under inspection. These devices have very limited use in very specific scenarios.

SUMMARY

A freeform metrology information acquisition system is disclosed. The system includes a measurement probe, one or more cameras, and a computing device. The measurement probe is configured to obtain metrology information for an object under inspection. The one or more cameras are configured to image a scene including the measurement probe and the object under inspection. The computing device is communicatively coupled to the measurement probe and the one or more cameras. The computing device is configured to receive the metrology information from the measurement probe, receive one or more images from the one or more cameras, determine a position of the measurement probe in the scene based at least on the one or more images, spatially registering the metrology information acquired by the measurement probe to one or more determined positions of the measurement probe in the scene, and visually present, via a display, a visual representation of the metrology information spatially registered to the one or more determined positions of the measurement probe in the scene.

DETAILED DESCRIPTION

Traditional methods of metrology information acquisition rely on devices that have complex assemblies that are configured to acquire metrology information for specific objects under inspection. In one example, traditional ultrasound inspection relies upon devices that include a complex assembly of encoders, linear bearings, shafts, etc. to keep track of the position of an ultrasonic transducer in three-dimensional (3D) space during ultrasonic inspection of an object. A traditional ultrasound inspection device has to be physically attached to an object in order to perform ultrasonic inspection of the object. In one example, a traditional ultrasonic inspection device is specifically configured to be physically attached to a pipe to perform ultrasonic inspection of the pipe. In another example, a traditional ultrasonic inspection device is specifically configured to be physically attached to a flat surface, such as a carbon fiber panel, to inspect the carbon fiber panel. In these examples, the traditional ultrasonic inspection devices are configured for specific applications (e.g., pipes, flat surfaces) and do not have the flexibility to perform ultrasound inspection on other types of objects having different shapes or different types of surfaces.

However, in many cases, it is not possible to attach these types of traditional ultrasonic inspection devices to objects other than the certain types of objects for which they are specifically designed. For example, the surface of an object may be non-magnetic, slippery, hot/cold, or may have other characteristics that impede physical attachment of a traditional ultrasonic inspection device to the object.

Furthermore, there is increasing demand for composite structures that are organically shaped and curved to be inspected using ultrasound-based techniques. Most inspection surfaces of such composite structures are not standard shapes, such as pipe or a flat surface. Traditional ultrasonic inspection devices are rigid and non-flexible which do not permit accurate surface measurements of composite structures (or other objects made of different materials) having organic shapes and curves. Moreover, traditional ultrasonic inspection devices are only two-dimensional. Currently, there is no method of capturing three-dimensional position data for industrial ultrasound measurement systems. Note that the issues present in traditional ultrasonic inspection devices also apply to other types of traditional metrology information acquisition devices.

Accordingly, the present description is directed to a freeform metrology information acquisition system. The system comprises a measurement probe configured to obtain metrology information for an object under inspection. The system further comprises one or more cameras configured to image a scene including the measurement probe and the object under inspection. The system further comprises a computing device configured to determine a position of the measurement probe in the scene, spatially register the metrology information acquired by the measurement probe to one or more determined positions of the measurement probe in the scene, and visually present a visual representation of the metrology information spatially registered to the one or more determined positions of the measurement probe in the scene via a display.

The freeform metrology information acquisition system leverages machine vision to enable a universal coordinate system to be used to spatially register metrology information to an object under inspection. Such spatial registration of the metrology information to the object under inspection provides the technical benefit of offering visual feedback that allows for a state or quality of the object under inspection to be more easily assessed relative to other metrology information acquisition systems. Moreover, the freeform metrology information acquisition system can be used on any number of different objects having complex, extensive, and/or non-standard surfaces. In contrast, traditional metrology information acquisition systems would be unable to accurately acquire metrology information for these types of objects.

Figure 1:
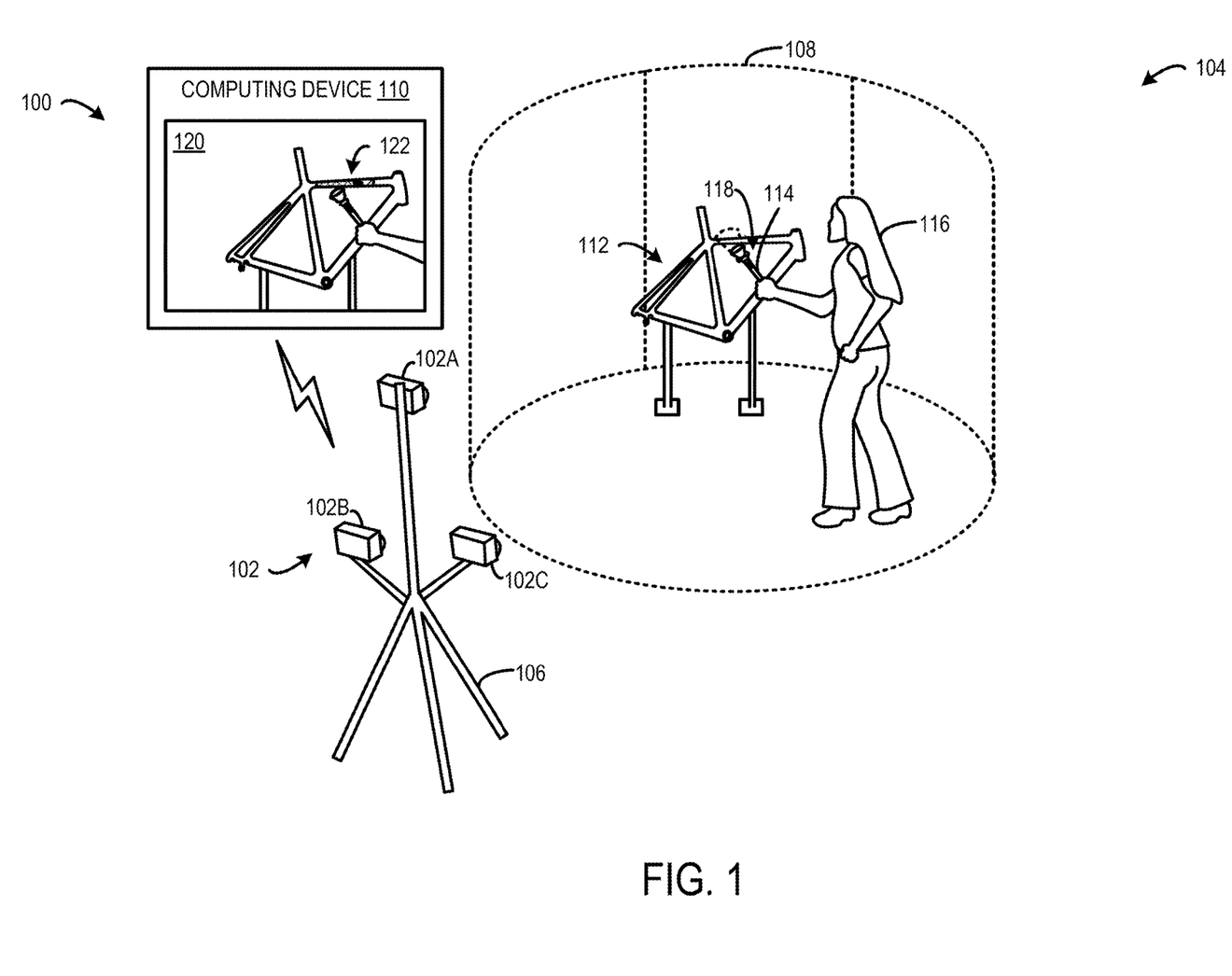
FIG. 1 shows an embodiment of a freeform metrology information acquisition system 100 according to the present disclosure.

FIG. 1 shows an embodiment of a freeform metrology information acquisition system 100 according to the present disclosure. The system 100 comprises a plurality of cameras 102 (e.g., 102A, 102B, and 102C) that have fixed positions with respect to one another and with respect to a scene 104. In the illustrated embodiment, the plurality of cameras are coupled to a rigid frame 106 that maintains the fixed positions and fixed orientations of the plurality of cameras 102. Each of the plurality of cameras 102 capture a different vantage point of a capture volume 108 in the scene 104. The capture volume 108 is defined as a 3D space captured by the collective fields of view of the plurality of cameras 102. The plurality of cameras 102 are calibrated to have a common coordinate system that is applied to the capture volume 108 as well as objects in the capture volume 108.

The system 100 comprises a computing device communicatively coupled to each of the plurality of cameras 102. The computing device 110 is configured to control operation of the plurality of cameras 102 to capture images of the capture volume 108 (including objects positioned therewithin). For example, the computing device 110 can control the plurality of cameras 102 to capture temporally synchronized images (or video streams including sequences of images) of the capture volume 108. The captured images are sent from the plurality of cameras 102 to the computing device 110 for computer processing.

An object 112 is positioned in the capture volume 108. The object 112 is referred to herein as the object under inspection because the system 100 acquires metrology information for the object. In the illustrated example, the object under inspection takes the form of a bicycle frame 112 having an organic and curved shape that would be difficult for a traditional ultrasonic inspection device to inspect. The computing device 110 is configured to determine a position and an orientation of the bicycle frame 112 in the common coordinate system of the plurality of cameras 102 based on images captured by the plurality of cameras 102.

In some examples, a plurality of fiducial markers (not shown) are placed at different positions on the bicycle frame 112, and the computing device 110 is configured to determine the position and/or orientation of the bicycle frame 112 based at least on the position of the fiducial markers. In other examples, the computing device 110 is configured to recognize various features (e.g., edges, curves) of the bicycle frame 112 and determine the position and/or orientation of the bicycle frame 112 based at least on such features. In some examples, different regions of the bicycle frame 112 are mapped to different coordinates of the common coordinate system of the plurality of cameras 102. The computing device 110 can determine the position and/or orientation of the bicycle frame 112 in any suitable manner.

The system 100 comprises a measurement probe 114 configured to acquire metrology information for an object under inspection. The measurement probe 114 is communicatively coupled with the computing device 110. The measurement probe 114 is configured to send the acquired metrology information to the computing device 110 for computer processing.

In the illustrated example, the measurement probe 114 includes an ultrasonic transducer that is configured to acquire subsurface information for an object under inspection. The measurement probe 114 is held by a human subject—i.e., an inspector 116. The inspector 116 moves the measurement probe 114 along the bicycle frame 112 to scan various parts of the bicycle frame 112 to acquire subsurface information via the ultrasonic transducer. The subsurface information characterizes a structural state of the various parts of the bicycle frame 112. For example, the subsurface information can be used to identify defects, other forms of degradation, or other structural characteristics in the bicycle frame 112.

The measurement probe 114 is referred to herein as being freeform, because the measurement probe 114 can be moved freely throughout the capture volume 108 to acquire metrology information for various parts or regions of interest of the bicycle frame 112 (or another object under inspection). The freeform nature of the measurement probe 114 means that the measurement probe 114 is not required to be attached to an object under inspection in order to acquire metrology information for the object under inspection. This allows the inspector 116 to quickly and flexibly scan any desired part or region of interest of the bicycle frame 112 to acquire subsurface information via the ultrasonic transducer for that desired part or region of interest.

Movement of the measurement probe 114 is tracked by the computing device 110. To that end, the measurement probe 114 includes a plurality of fiducial markers 118 having positions fixed relative to one another. The plurality of fiducial markers 118 form a fixed pattern, referred to as a rigid object, that is a non-deformable structure whose orientation and position can be tracked by the computing device 110. In the illustrated example, the measurement probe 114 includes four fiducial markers that enable the computing device to determine the position and orientation of the measurement probe 114.

The computing device 110 is configured to determine the position and orientation of the measurement probe 114 in the scene 104 based at least on the positions of the plurality of fiducial markers 118 in the images captured by the plurality of cameras 102. Further, the computing device 110 is configured to spatially register the metrology information acquired by the measurement probe 114 to one or more determined locations of the measurement probe 114 in the scene. In one example, the computing device 110 is configured to determine a position of the measurement probe 114 when the measurement probe 114 acquires subsurface information via the ultrasonic transducer. For example, such subsurface information may be augmented with metadata that includes a timestamp indicating the time at which the subsurface information is acquired. The computing device 110 is configured to match the timestamped subsurface information with corresponding images captured by the plurality of cameras 102 having the same or similar timestamps to spatially register the subsurface information to the determined location of the measurement probe 114. In the illustrated example, the determined location corresponds to the distal end of the measurement probe 114 where the ultrasonic transponder resides.

The computing device 110 is configured to visually present, via a display 120, a visual representation 122 of the metrology information acquired by the measurement probe 114 and spatially registered to the determined location(s) of the measurement probe in the scene 104. In the illustrated example, the visual representation 122 of the metrology information is subsurface information represented by different patterns (e.g., a heat map) that is textured spatially registered to the location of the bicycle frame 112 in the image presented via the display 120. In this example, as the inspector 116 scans the bicycle frame 112 with the measurement probe 114, the subsurface information acquired by the ultrasonic transducer is presented on the display 120 in spatial alignment with the bicycle frame 112. In some examples, the computing device 110 may generate a composite image/video that admixes the scene image/video with the visual representation of the subsurface information spatially aligned with the bicycle frame 112.

In the illustrated example, the system 100 combines the 3D machine vision coordinate tracking system with the ultrasound subsurface information to allow for a deeper understanding of the structure of the object being inspected—e.g., the bicycle frame 112. Further, the system 100 combines the object shape and volume information with the material thickness and ultrasound information to provide a cohesive visualization of the internal condition of the bicycle frame 112.

Figure 2:
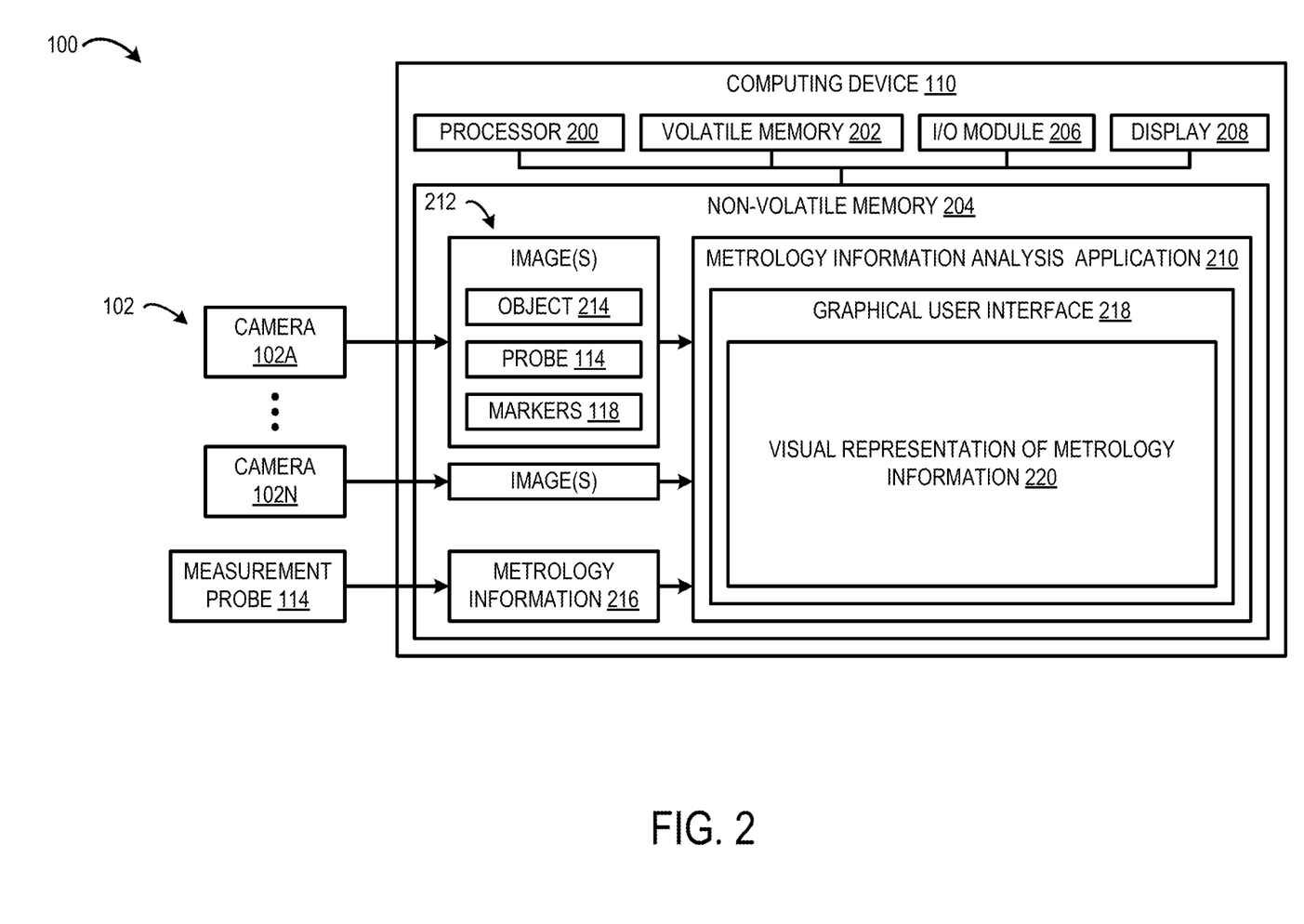
FIG. 2 shows a schematic view of the freeform metrology acquisition system shown in FIG. 1.

FIG. 2 shows a schematic view of the freeform metrology acquisition system 100 including the computing device 110. The computing device 110 includes a processor 200 (e.g., central processing units, or "CPUs"), volatile memory 202, non-volatile memory 204, an input/output (I/O) module 206, and a display 208. The different components are operatively coupled to one another. The non-volatile memory 204 stores instructions to execute a metrology information analysis application 210. The metrology information analysis application 210 is configured to receive one or more images 212 a scene including an object under inspection 214 and a measurement probe 114 from one or more cameras 102 (e.g., cameras 102A . . . 102N).

The camera(s) 102 may take any suitable form. In some examples, the camera(s) may include visible-light cameras (e.g., R, G, B cameras). In some examples, the camera(s) may include infrared or near-infrared cameras. In some examples, the camera(s) may include depth cameras (e.g., structured light, time-of-flight). In some examples, the camera(s) may include a combination of the different types of cameras listed above or another type of camera.

The system 100 may include any suitable number of cameras 102. In some embodiments, the system 100 may include a plurality of cameras having fixed positions relative to one another. In other embodiments, the system 100 may include a single fixed or movable camera.

It will be appreciated that calibration of the camera(s) 102 may be performed in virtually any suitable manner to establish the common coordinate system. For example, various different types of calibration markers may be used to create data points for interpolation of intrinsic and extrinsic properties of the camera(s) 102. As another example, various different calibration patterns, such as grid or checkerboard patterns, may be used to create data points for camera calibration.

Figure 3:
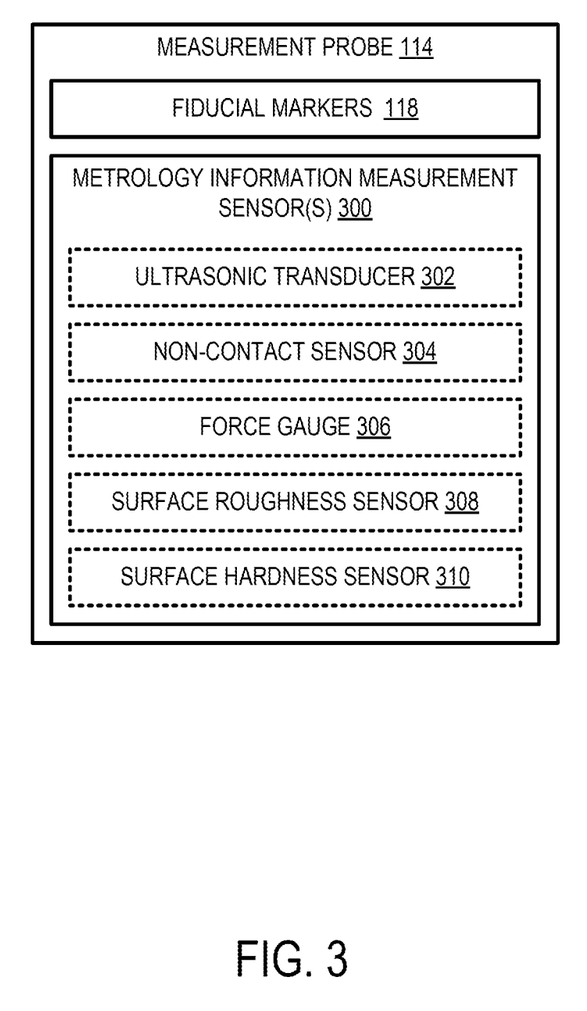
FIG. 3 shows a schematic view of a measurement probe of the freeform metrology information acquisition system shown in FIG. 1.

The metrology information analysis application 210 is configured to receive metrology information for the object under inspection 214 from the measurement probe 114. FIG. 3 shows a schematic view of the measurement probe 114. The measurement probe 114 includes the plurality of fiducial markers 118 that have positions that are fixed relative to one another. The metrology information analysis application 210 is configured to determine the position of the measurement probe 114 in the scene based at least on the positions of the plurality of fiducial markers 118 in the one or more images 212. The measurement probe 114 may include any suitable number of fiducial markers 118 arranged in any suitable pattern.

The plurality of fiducial markers 118 have characteristics that are conspicuous to the camera(s) 102. In examples where the camera(s) 102 are visible light cameras (e.g., R, G, B cameras), the plurality of fiducial markers 118 may have a high-contrast color (e.g., white) that is conspicuous to the camera(s) 102. In some examples, the fiducial markers 118 may be color-light invisible, such that the fiducial markers are not perceivable by the naked eye of a human subject. In some examples where the camera(s) 102 are IR or near-IR cameras, the plurality of fiducial markers 118 are infrared-visible. In one example, the fiducial markers 118 are infrared reflective markers (e.g., the markers include infrared-reflective paint or stickers) that are configured to passively reflect infrared light emitted from the plurality of cameras 102 (or a separate active infrared light source). In another example, the fiducial markers 118 include active infrared illuminators (e.g., infrared LEDs) that are conspicuous to the IR or near-IR camera(s) 102.

In some examples, the fiducial markers 118 may be contained inside the measurement probe 114 and occluded from a human observer. Physical properties of the measurement probe 114 may allow for the unobstructed passage of IR light from the fiducial markers 118 through the measurement probe 114 to the camera(s) 102.

In yet other examples, knowledge of the shape and appearance of the measurement probe 114 may be sufficient to serve the purpose of fiducial markers. For example, a planar surface, a right angle, or another geometric feature on the measurement probe 114 may be used as a fiducial marker.

Note that in some examples the object under inspection 214 may also include fiducial markers that allow for the metrology information analysis application 210 to determine the position and orientation of the object under inspection 214.

The measurement probe 114 includes one or more metrology information sensors 300 that are configured to acquire metrology information 216 for the object under inspection 214. The metrology information sensors 300 may include any suitable type and/or number of metrology sensors that are configured to acquire any suitable type of metrology information 216 for the object under inspection 214. The metrology information 216 provides standard units of measurement that are used to describe physical characteristics of the object under inspection 214. For example, the metrology information 216 for the object under inspection 214 can be acquired to assess a state or quality of the object under inspection 214. In particular, the metrology information 216 for the object under inspection 214 can be compared to specified thresholds or requirements to determine whether conformity is achieved for different physical characteristics of the object under inspection 214.

In some embodiments, the measurement probe 114 includes an ultrasonic transducer 302 configured to acquire metrology information 216 in the form of subsurface information for the object under inspection 214. For example, the subsurface information may be used to identify material defects, other types of degradation, or structure characteristics of various regions of the object under inspection 214.

In some embodiments, the measurement probe 114 includes a non-contact sensor 304 configured to acquire metrology information 216 in the form of electromagnetic radiation information for the object under inspection 214. For example, the electromagnetic radiation information may be used to indicate radiation levels emitted by various regions of the object under inspection 214.

In some embodiments, the measurement probe 114 includes a force gauge 306 configured to acquire metrology information 216 in the form of force information for the object under inspection 214. For example, the force information may be used to measure compression, tension, peel, or a coefficient of friction of various regions of the object under inspection 214.

In some embodiments, the metrology information 216 acquired by the measurement probe 114 can be used to determine a position of a local elastic modulus of a region of the object under inspection 214. In some examples, the position of the local elastic modulus can be determined based on subsurface information acquired via an ultrasonic transducer of the measurement probe 114 and the position of the measurement probe 114 when the subsurface information is acquired. In other examples, the position of the local elastic modulus can be determined based on force information acquired via a force gauge of the measurement probe 114 and the position of the measurement probe 114 when the force information is acquired.

In some embodiments, the measurement probe 114 includes a surface roughness sensor 308 configured to acquire metrology information 216 in the form of surface roughness information for the object under inspection 214. In some embodiments, the measurement probe 114 includes a surface hardness sensor 310 configured to acquire metrology information 216 in the form of surface hardness information for the object under inspection 214. In some embodiments, the measurement probe 114 includes a combination sensor that measures both surface hardness and surface roughness of a surface of the object under inspection 214.

Returning to FIG. 2, the metrology information analysis application 210 may be configured to determine the position and/or orientation of the object under inspection 214 and determine the position and/or orientation of the measurement probe 114 based at least on the images 212 captured by the camera(s) 102 in any suitable manner. In one example, the metrology information analysis application 210 is configured to determine the position and orientation of the object under inspection 214 and the measurement probe 114 using direct linear transformation of positions of the fiducial markers 118 relative to one another. In some examples, determined positions of the object under inspection 214 and the measurement probe 114 may be defined in three degrees of freedom (e.g., X, Y, Z). In other examples, determined positions and orientations of the object under inspection 214 and the measurement probe 114 may be defined in six degrees of freedom (e.g., X, Y, Z, pitch, roll, yaw). Further, in the same manner, the metrology information analysis application 210 may be configured to track motion of the measurement probe 114 (and in some cases the object under inspection 214 if it moves) over time based on video (or a temporal sequence of images) captured by the camera(s) 102.

As discussed above, in some embodiments, the measurement probe 114 may be moved or controlled by a human inspector. In other embodiments, the measurement probe 114 may be moved or controlled via a robot. For example, the robot may move the measurement probe 114 through a movement routine (pre-programed or dynamically specified) that allows for the measurement probe 114 to scan the object under inspection 214 to acquire metrology information.

The metrology information analysis application 210 includes a graphical user interface (GUI) 218 that is displayed via the display 208. The GUI 218 facilitates presentation of metrology information 216 acquired by the measurement probe 114 for the object under inspection 214. In particular, the metrology information analysis application 210 is configured to spatially register the metrology information 216 acquired by the measurement probe 114 to one or more determined positions of the measurement probe 114 in the scene 104. In one example, such spatial registration is embodied as a data structure, such as a vector that includes one or more metrology information values and spatial coordinate values corresponding to the position of the measurement probe 114 when the measurement probe 114 acquired the one or more metrology information values. Further, the metrology information analysis application 210 is configured to recognize when spatially registered metrology information values coincide with particular regions of the object under inspection 214 and associate the metrology information values with the particular regions of the object under inspection 214.

The metrology information analysis application 210 is configured to visually present, in the GUI 218, a visual representation 220 of the metrology information spatially registered to determined positions of the measurement probe in the scene. The visual representation 220 of the metrology information spatially registered with the object under inspection 214 provides visual feedback to the inspector or another analyst. The visual representation 220 of the metrology information may take any suitable form.

Figure 4:
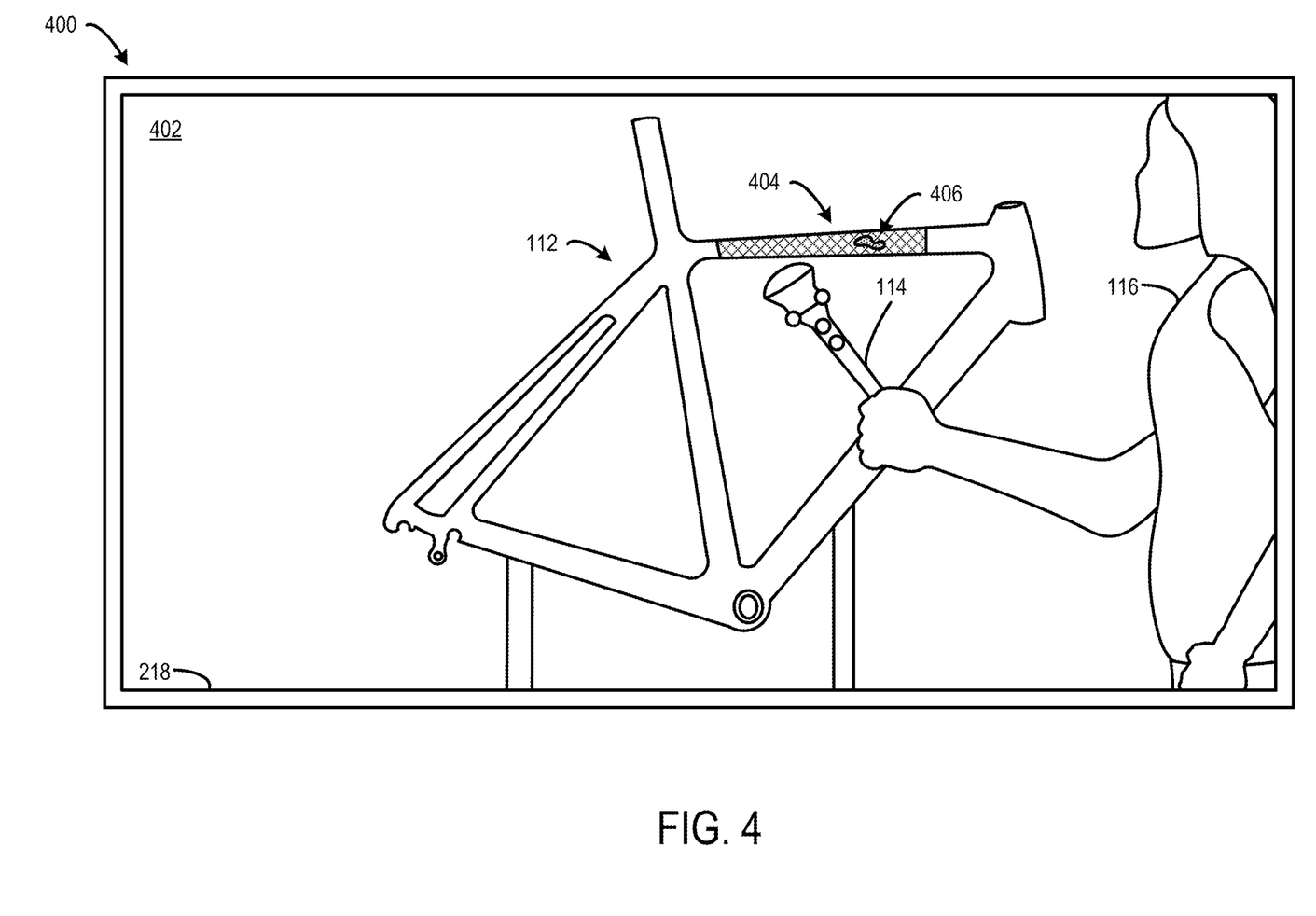
FIG. 4 shows an example visual representation of metrology information spatially registered to an object under inspection.

In some embodiments, the visual representation 220 of the metrology information is incorporated into one or more images of the object under inspection captured by the camera(s) 102. FIG. 4 shows an example use case 400 in which the metrology information analysis application 210 generates and displays a visual representation of metrology information spatially registered to an object under inspection. In the illustrated example, the GUI 218 includes an image of the bicycle frame 112 (from FIG. 1) being inspected by the inspector 116. The inspector 116 scans the bicycle frame 112 with the measurement probe 114, which includes the ultrasonic transducer, to acquire subsurface information for the bicycle frame 112. A visual representation 404 of the subsurface information is incorporated into the image 402, such that the visual representation 404 of the subsurface information is spatially registered to a region of the bicycle frame 112 that is scanned by the measurement probe 114. Note that only the portion of the bicycle frame 112 that has been scanned by the measurement probe 114 is augmented with spatially registered subsurface information, in this example.

In the illustrated example, the subsurface information is visually represented using different patterns to indicate different states of the material that make up the bicycle frame 112. In particular, a region 406 of the bicycle frame 112 where a defect is present as informed by the subsurface information is visually distinguished by a different pattern than the surrounding material that is defect-free as informed by the subsurface information. In some examples, the visual representation 220 may take the form of a heat map indicating different levels of material thickness or other structural characteristics. In some examples, the subsurface information may be represented as a two-dimensional ultrasonic B-scan that shows a cross-sectional view of the inspected material depicting material thickness measured at different positions over time and spatially aligned with the bicycle frame 112 in the image 402.

The image 402 augmented with the visual representation 404 of the spatially registered subsurface information enables an inspector (or another analyst) to analyze the internal condition of the bicycle frame 112 in a quick and simple fashion without having to deal with the issues associated with traditional ultrasound inspection devices that have to be physically attached to an object and constantly adjusted for ultrasonic inspection.

In some examples, the image 402 may be displayed in the GUI 218 as a "live" image or incorporated into a "live" video, that provides instant visual feedback to the inspector 116 as the inspector 116 is scanning the bicycle frame 112. In other examples, the image 402 may be generated from a previous inspection event/session and displayed in the GUI 218 for review by an analyst after the scan of the bicycle frame 112 with the measurement probe 114 has been completed. Such "replay" functionality may allow for an ordinary inspector to perform the act of scanning an object under inspection to acquire metrology information for the object under inspection. Then, an expert analyst can review the image/video 402 augmented with the visual representation 404 of the spatially registered metrology information in order to perform analysis on the object under inspection 112 at their convenience.

Figure 5:
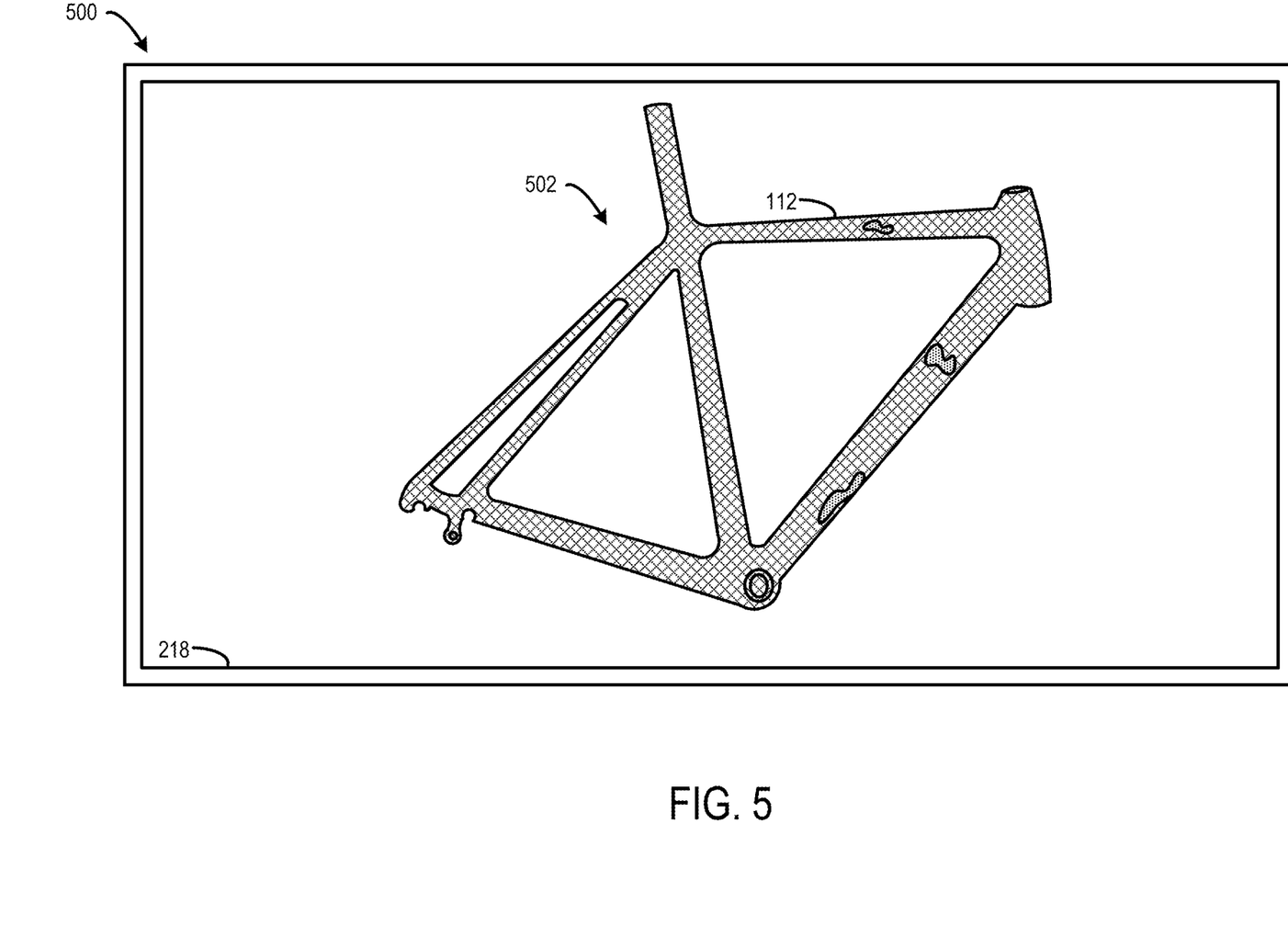
FIG. 5 shows an example 3D model of an object under inspection textured with metrology information spatially registered to corresponding regions of the object under inspection.

In some embodiments, the visual representation 220 of the metrology information includes a model of the object under inspection 214. FIG. 5 shows an example use case 500 in which the metrology information analysis application 210 generates and displays a 3D model of the object under inspection textured with metrology information spatially registered to corresponding regions of the object under inspection. In the illustrated example, the GUI 218 includes a 3D model 502 of the bicycle frame 112 (from FIG. 1). The 3D model 502 is textured with subsurface information acquired by the ultrasonic transducer of the measurement probe 114. The subsurface information is represented as different patterns corresponding to different structural states or characteristics of the material that make up the bicycle frame 112. For example, the patterns representing the subsurface information may indicate various material thicknesses and may distinguish between degraded and non-degraded regions within the bicycle frame 112. In some examples, the different patterns representing the subsurface information may have a high granularity of inspection by distinguishing the type of degradation, such as cracks, gaps, manufacturing flaws, and other forms of degradation. In one example, the subsurface information may be represented as an ultrasonic C-scan representing material thickness plotted over position both horizontally and vertically. The C-scan provides a visual map that reveals patterns of degradation as overall trends as well as at a granular point-level.

In some examples, the 3D model 502 is manipulatable, such that a view of the 3D model 502 can be changed (e.g., rotated, zoomed in/out). Such manipulation of the 3D model may allow for an analyst to easily view subsurface information for any particular region of interest of the of the bicycle frame 112 even though the shape of the bicycle frame 112 has significant complexity.

In some examples where the object under inspection includes movable parts, the metrology information analysis application 210 may be configured to create a kinematic 3D model of the object under inspection. Such a kinematic 3D model may represent various moving parts of an object under inspection with various movement constraints of the different parts. Further, the kinematic 3D model may include different subsurface information based on the different positions of the moving parts. For example, a particular part may have different levels of stain when moved to one position relative to another position.

Figure 6:
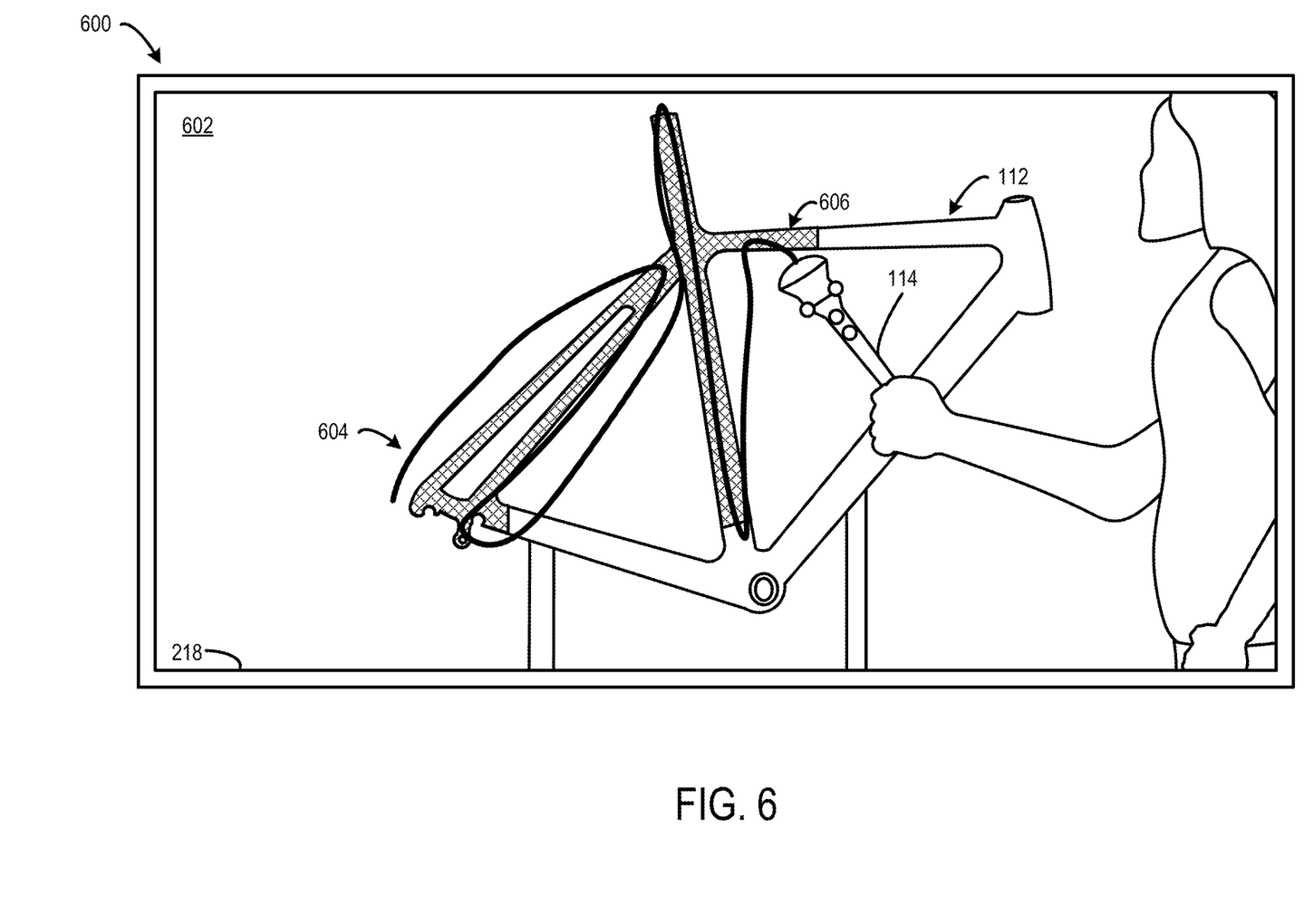
FIG. 6 shows an example visual representation of a motion path of a measurement probe as the measurement probe scans an object under inspection.

In some embodiments, the visual representation 220 provides feedback that guides an inspector to accurately acquire metrology information 216 for the object under inspection 214. FIG. 6 shows an example use case 600 in which the metrology information analysis application 210 generates and displays a visual representation 602 including a motion path 604 of the measurement probe 114 in the GUI 218. The motion path 604 visually tracks motion of the measurement probe 114 over a designated time period. The designated time period may be specified in any suitable manner. In some examples, the designated time period is pre-determined. In some examples, the designated time period is user-specified. In some examples, the metrology information analysis application 210 is configured to toggle display of the motion path 604 on and off as desired by an inspector or analyst that is viewing the visual representation 602.

Additionally, the visual representation 602 includes metrology information 606 acquired by the measurement probe 114 at different points along the motion path 604. The metrology information 606 is spatially registered to the position of the bicycle frame 112 as the measurement probe 114 scans the different regions of the bicycle frame 112. The visual representation 602 indicates regions of the bicycle frame 112 that have been scanned by the measurement probe 114 and regions of the bicycle frame 112 that have not been scanned by the measurement probe 114. In the illustrated example, the regions that have been scanned are distinguished by the metrology information 606 being spatially registered to the regions. On the other hand, the regions that have not been scanned show the un-augmented exterior/surface of the bicycle frame 112. In different examples, the different regions may be distinguished from one another in any suitable manner. In some examples, the scanned and non-scanned regions may have different colors to help guide the inspector.

In some examples, the visual representation 602 may include a video that is augmented with the motion path 604. In some examples, the video can be paused at different time stamps to show the position of the measurement probe 114 at that time stamp and the corresponding ultrasound data generated at the time stamp. In some examples, the GUI 218 may be configured to toggle between different views including an actual view (non-augmented), a motion path view, and an ultrasound information view. In some examples, the different views may be overlaid on one another or composited together to form a hybrid view.

Although these concepts have been described mostly within the context of ultrasonic analysis, the herein-described concepts are broadly applicable to any suitable form of metrology information acquisition for an object under inspection.

Further, the system may take any suitable form. In some embodiments, the measurement probe, camera(s), and/or computer may be incorporated into a common device, such as a mobile device (e.g., hand-held device). In some examples, the system may include a head-mounted device including a display, camera(s), and/or computer. In some examples, the measurement probe may be wired or wirelessly connected to the head-mounted device. In some examples, the computer may include a remote computing system (e.g., a cloud computing system).

Figure 7:
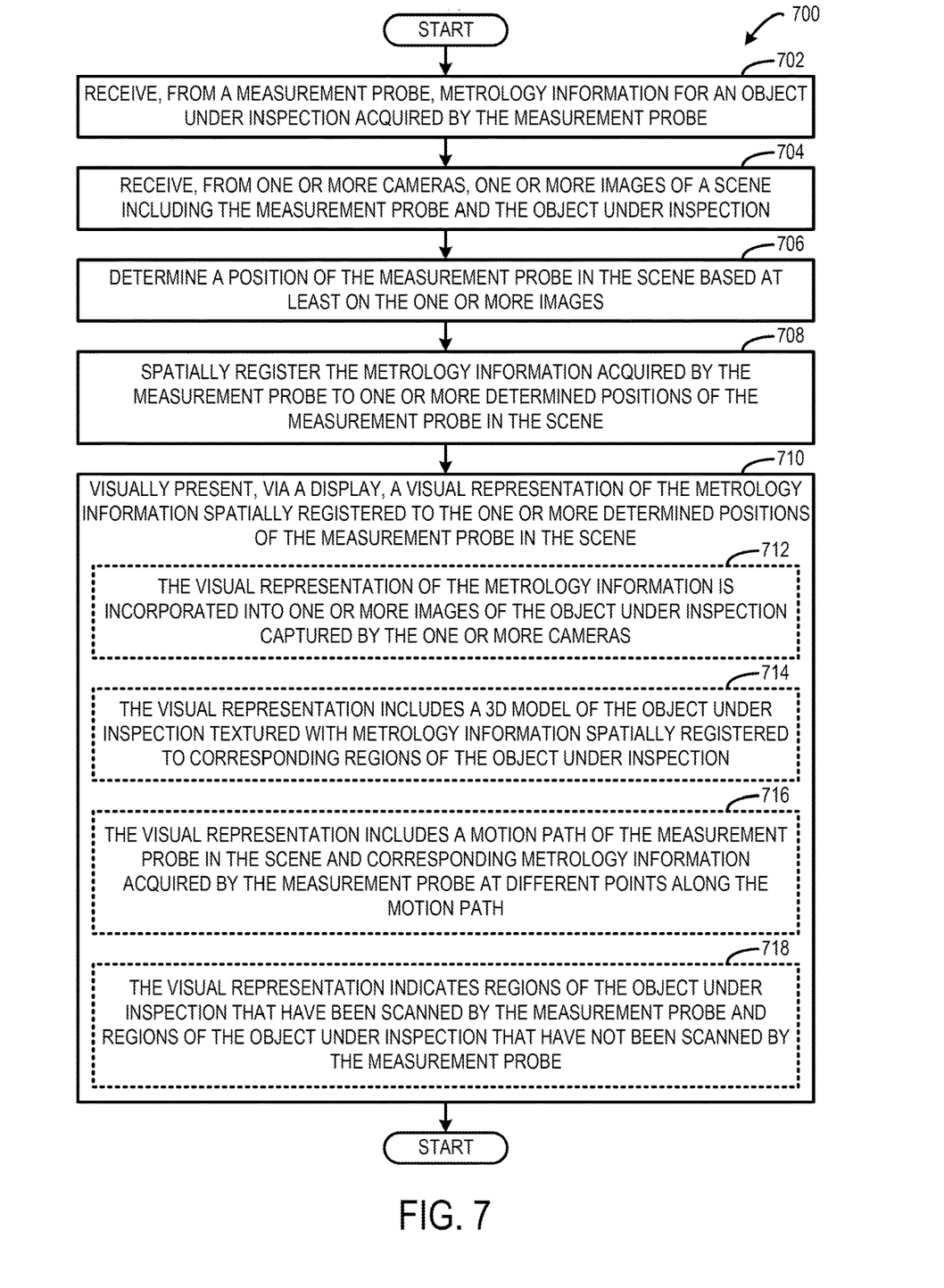
FIG. 7 is a flowchart of an example computer-implemented freeform metrology information acquisition method.

FIG. 7 is a flow chart of an example computer-implemented freeform metrology acquisition method 700. For example, the computer-implemented method 700 may be performed by the computing device 110 shown in FIGS. 1 and 2 or another computing device.

At 702, the computer-implemented method 700 includes receiving, from a measurement probe, metrology information for an object under inspection acquired by the measurement probe.

At 704, the computer-implemented method 700 includes receiving, from one or more cameras, one or more images of a scene including the measurement probe and the object under inspection;

At 706, the computer-implemented method 700 includes determining a position of the measurement probe in the scene based at least on the one or more images;

At 708, the computer-implemented method 700 includes spatially registering the metrology information acquired by the measurement probe to one or more determined positions of the measurement probe in the scene; and At 710, the computer-implemented method 700 includes visually presenting, via a display, a visual representation of the metrology information spatially registered to the one or more determined positions of the measurement probe in the scene. In some embodiments, at 712, the visual representation of the metrology information optionally may be incorporated into one or more images of the object under inspection captured by the one or more cameras. In some embodiments, at 714, a 3D model of the object under inspection textured with metrology information spatially registered to corresponding regions of the object under inspection. In some embodiments, at 716, the visual representation may include a motion path of the measurement probe in the scene and corresponding metrology information acquired by the measurement probe at different points along the motion path. In some embodiments, at 718, the visual representation may indicate regions of the object under inspection that have been scanned by the measurement probe and regions of the object under inspection that have not been scanned by the measurement probe.

The visual representation of the spatially register metrology information provides visual feedback that enables an inspector to accurately acquire metrology information for an object under inspection in a freeform manner. Moreover, the visual representation of the spatially register metrology information allows for an inspector or analyst to gain a deeper understanding of state of the underlying structure of the object being inspected in a quick and easily consumable manner.

In some embodiments, the methods and processes described herein may be tied to a computing system of one or more computing devices. In particular, such methods and processes may be implemented as a computer-application program or service, an application-programming interface (API), a library, and/or other computer-program product.

Figure 8:
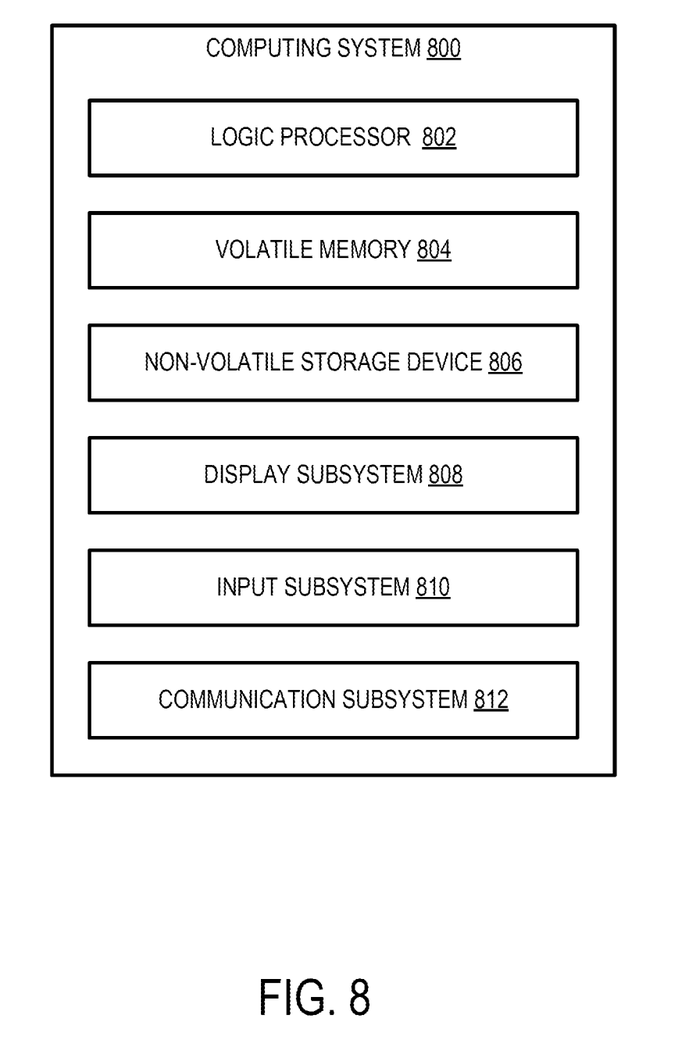
FIG. 8 schematically shows an example computing system environment in which the computing device of FIG. 1 may be implemented.

FIG. 8 schematically shows a non-limiting embodiment of a computing system 800 that can enact one or more of the methods and processes described above. Computing system 800 is shown in simplified form. Computing system 800 may embody the computing device 110 described above and illustrated in FIGS. 1 and 2. Computing system 800 may take the form of one or more personal computers, server computers, tablet computers, network computing devices, mobile computing devices, mobile communication devices (e.g., smart phone), wearable computing devices such as smart wristwatches and head mounted augmented reality devices, and/or other computing devices.

Computing system 800 includes a logic processor 802, volatile memory 804, and a non-volatile storage device 806. Computing system 800 may optionally include a display subsystem 808, input subsystem 810, communication subsystem 812, and/or other components not shown in FIG. 1.

Logic processor 802 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 802 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 806 includes one or more physical devices configured to hold instructions executable by the logic processors to implement the methods and processes described herein. When such methods and processes are implemented, the state of non-volatile storage device 806 may be transformed—e.g., to hold different data.

Non-volatile storage device 806 may include physical devices that are removable and/or built-in. Non-volatile storage device 806 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 806 may include nonvolatile, dynamic, static, read/write, read-only, sequential-access, location-addressable, file-addressable, and/or content-addressable devices. It will be appreciated that non-volatile storage device 806 is configured to hold instructions even when power is cut to the non-volatile storage device 806.

Volatile memory 804 may include physical devices that include random access memory. Volatile memory 804 is typically utilized by logic processor 802 to temporarily store information during processing of software instructions. It will be appreciated that volatile memory 804 typically does not continue to store instructions when power is cut to the volatile memory 804.

Aspects of logic processor 802, volatile memory 804, and non-volatile storage device 806 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 800 typically implemented in software by a processor to perform a particular function using portions of volatile memory, which function involves transformative processing that specially configures the processor to perform the function. Thus, a module, program, or engine may be instantiated via logic processor 802 executing instructions held by non-volatile storage device 806, using portions of volatile memory 804. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 808 may be used to present a visual representation of data held by non-volatile storage device 806. The visual representation may take the form of a graphical user interface (GUI). As the herein described methods and processes change the data held by the non-volatile storage device, and thus transform the state of the non-volatile storage device, the state of display subsystem 808 may likewise be transformed to visually represent changes in the underlying data. Display subsystem 808 may include one or more display devices utilizing virtually any type of technology. Such display devices may be combined with logic processor 802, volatile memory 804, and/or non-volatile storage device 806 in a shared enclosure, or such display devices may be peripheral display devices.

When included, input subsystem 810 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 812 may be configured to communicatively couple various computing devices described herein with each other, and with other devices. Communication subsystem 812 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 800 to send and/or receive messages to and/or from other devices via a network such as the Internet.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A freeform metrology information acquisition system, the system comprising:
   a measurement probe configured to obtain metrology information for an object under inspection;
   one or more cameras configured to image a scene including the measurement probe and the object under inspection; and
   a computing device communicatively coupled to the measurement probe and the one or more cameras, the computing device comprising:
   one or more processors configured to execute instructions stored in memory to:
      receive the metrology information from the measurement probe;
      receive from the one or more cameras a sequence of images of the scene including the measurement probe and the object under inspection;
      track a position of the measurement probe in the scene based at least on the sequence of images;
      spatially register the metrology information acquired by the measurement probe to tracked positions of the measurement probe in the scene;
      track a position of the object in the scene based at least on the sequence of images; and
      visually present, via a display, a visual representation of the object under inspection textured with a visual representation of at least some of the metrology information that has a tracked position in spatial alignment with the tracked position of the object under inspection.

2. The system of claim 1, wherein the visual representation of the object under inspection includes one or more images of the sequence of images, and wherein the visual representation of the at least some of the metrology information is incorporated into the one or more images.

3. The system of claim 1, wherein the one or more processors are configured to execute instructions stored in the memory to:
   visually present, via the display, a motion path of the measurement probe in the scene and corresponding metrology information acquired by the measurement probe at different points along the motion path.

4. The system of claim 1, wherein the visual representation of the object under inspection includes a three-dimensional (3D) model of the object under inspection.

5. The system of claim 1, wherein the visual representation of the object under inspection indicates regions of the object under inspection that have been scanned by the measurement probe and regions of the object under inspection that have not been scanned by the measurement probe.

6. The system of claim 1, wherein the measurement probe includes a plurality of markers having positions fixed relative to one another, and wherein the computing device is configured to determine the position of the measurement probe in the scene based at least on the positions of the plurality of markers in the sequence of images.

7. The system of claim 1, wherein the measurement probe includes an ultrasonic transducer, and wherein the metrology information includes subsurface information acquired by the ultrasonic transducer for the object under inspection.

8. The system of claim 1, wherein the measurement probe includes a non-contact sensor, and wherein the metrology information includes electromagnetic radiation information acquired by the non-contact sensor for the object under inspection.

9. The system of claim 1, wherein the measurement probe includes a force gauge, and wherein the metrology information includes force information acquired by the force gauge for the object under inspection.

10. The system of claim 1, wherein the computing device is configured to determine a position of a local elastic modulus of a region of the object under inspection based on the metrology information acquired by the measurement probe and a determined position of the measurement probe.

11. A computer-implemented freeform metrology information acquisition method, the method comprising:
receiving, from a measurement probe, metrology information for an object under inspection acquired by the measurement probe;
receiving, from one or more cameras, a sequence of images of a scene including the measurement probe and the object under inspection;
tracking a position of the measurement probe in the scene based at least on the sequence of images;
spatially registering the metrology information acquired by the measurement probe to tracked positions of the measurement probe in the scene;
tracking a position of the object in the scene based at least on the sequence of images; and
visually presenting, via a display, a visual representation of the object under inspection textured with a visual representation of at least some of the metrology information that has a tracked position in spatial alignment with the tracked position of the object under inspection.

12. The method of claim 11, wherein the visual representation of the object under inspection includes one or more images of the sequence of images, and wherein the visual representation of the at least some of the metrology information is incorporated into the one or more images.

13. The method of claim 11, further comprising:
visually presenting, via the display, a motion path of the measurement probe in the scene and corresponding metrology information acquired by the measurement probe at different points along the motion path.

14. The method of claim 11, wherein the visual representation of the object under inspection includes a 3D model of the object under inspection.

15. The method of claim 11, wherein the visual representation of the object under inspection indicates regions of the object under inspection that have been scanned by the measurement probe and regions of the object under inspection that have not been scanned by the measurement probe.

16. The method of claim 11, wherein the measurement probe includes a plurality of markers having positions fixed relative to one another, and wherein the method further comprises determining the position of the measurement probe in the scene based at least on the positions of the plurality of markers in the sequence of images.

17. The method of claim 11, wherein the measurement probe includes an ultrasonic transducer, and wherein the metrology information includes subsurface information acquired by the ultrasonic transducer for the object under inspection.

18. The method of claim 11, wherein the measurement probe includes a non-contact sensor, and wherein the metrology information includes electromagnetic radiation information acquired by the non-contact sensor for the object under inspection.

19. The method of claim 11, wherein the measurement probe includes a force gauge, and wherein the metrology information includes force information acquired by the force gauge for the object under inspection.

20. A computing device comprising:
one or more processors configured to execute instructions stored in memory to:
receive from a measurement probe metrology information for an object under inspection acquired by the measurement probe;
receive from one or more cameras a sequence of images of a scene including the measurement probe and the object under inspection;
track a position of the measurement probe in the scene based at least on the sequence of images;
spatially register the metrology information acquired by the measurement probe to tracked positions of the measurement probe in the scene;
track a position of the object in the scene based at least on the sequence of images; and
visually present, via a display, a visual representation of the object under inspection textured with a visual representation of at least some of the metrology information that has a tracked position in spatial alignment with the tracked position of the object under inspection.

* * * * *